(12) United States Patent
Roehr (10) Patent No.: US 7,251,152 B2
(45) Date of Patent: Jul. 31, 2007

(54) MEMORY CIRCUIT HAVING MEMORY CELLS WHICH HAVE A RESISTANCE MEMORY ELEMENT

(75) Inventor: Thomas Roehr, Aschheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/213,372

(22) Filed: Aug. 26, 2005

(65) Prior Publication Data
US 2006/0050546 A1  Mar. 9, 2006

(30) Foreign Application Priority Data
Aug. 26, 2004  (DE) .................. 10 2004 041 330

(51) Int. Cl.
*G11C 17/00* (2006.01)
*G11C 11/00* (2006.01)
(52) U.S. Cl. ............... 365/100; 365/148; 365/158; 365/171; 365/173
(58) Field of Classification Search ........... 365/100, 365/148, 158, 163, 171, 173
See application file for complete search history.

(56) References Cited
U.S. PATENT DOCUMENTS
6,795,329 B2  9/2004  Jacob
7,068,533 B2 *  6/2006  Ferrant et al. ............. 365/158

FOREIGN PATENT DOCUMENTS
WO  WO2004001760  12/2003
WO  WO2004017328  2/2004

* cited by examiner

*Primary Examiner*—Trong Phan
(74) *Attorney, Agent, or Firm*—Patterson & Sheridan, L.L.P.

(57) ABSTRACT

In a memory circuit having memory cells which are connected in series between a ground line PL and a bit line BL and in each case have a resistance memory element said element having a bipolar switching behavior having an anode electrode and a cathode electrode, and a drive transistor connected in parallel with the resistance memory element, the drive transistors of the memory cells in each case are connected to a word line in order to switch the drive transistor on and off in such a way that a current path is formed via the associated drive transistor in a non-activated state of a memory cell and a current path is formed via the associated resistance memory element in an activated state of a memory cell, a first changeover switch being arranged at one end and a second changeover switch at other ends of the series of memory cells in order alternately to produce a connection between the series-connected memory cells and the ground line and the bit line in a manner dependent on an applied address.

27 Claims, 9 Drawing Sheets

MEMORY CIRCUIT HAVING MEMORY CELLS WHICH HAVE A RESISTANCE MEMORY ELEMENT

CROSS-REFERENCE TO RELATED APPLICATIONS

This application claims foreign priority benefits under 35 U.S.C. §119 to co-pending German patent application number DE 10 2004 041 330.4, filed 26 Aug. 2004. This related patent application is herein incorporated by reference in its entirety.

BACKGROUND OF THE INVENTION

1. Field of the Invention

The invention relates to a memory circuit having memory cells which have a resistance memory element, wherein the resistance memory element exhibits a bipolar switching behavior.

2. Description of the Related Art

The development of semiconductor memory technology is essentially driven by the requirement for increasing the performance of the semiconductor memories in conjunction with miniaturization of the feature sizes. However, further miniaturization of the semiconductor memory concepts based on storage capacitors may be difficult due to the large quantity of charge that is required for writing to and reading from the storage capacitors which leads to a high current demand. Therefore, thought is increasingly being given to new cell concepts that are distinguished by a significantly lower quantity of charge for the writing and reading operation. Semiconductor memories having a resistance memory element which exhibits a bipolar switching behavior are one such new promising circuit architecture.

One possible memory concept having a resistance memory element is the so-called CBRAM (conductive bridging RAM) cell, in which the resistance memory element comprises an inert cathode electrode, a reactive anode electrode and also a porous, highly resistive ionically conductive carrier material in between. Through application of an electric field between the two electrodes, it is possible to produce a conductive path through the carrier material and to clear it away again. Depending on the polarity of the electrical pulses applied between anode electrode and cathode electrode, the reactive anode electrode is dissolved electrochemically and the metal-rich deposits on the carrier material are intensified, which then leads to an electrically conductive connection between the electrodes, or the electrically conductive connection is resolved again, the metal ions depositing from the carrier material on the anode electrode.

CBRAM memory cells can thus be switched back and forth between a high-and low-resistance state by means of electrical pulses, the different resistance values then each being assigned a logic state. Furthermore, CBRAM cells are distinguished by a low area requirement, which is a minimum of 4 $F^2$, where F is the feature size of the fabrication technology under consideration.

In addition to CBRAM cells, further resistive memory cell concepts are currently being investigated, such as the phase change memory principle (used in phase change RAM, or PCRAM), for example, in which a metal alloy is heated by means of electrical pulses and switched between an amorphous and crystalline phase state in the process. The two states may be distinguished by a difference in their conductivity, which can be utilized for the electrical read-out of the memory cell state. A further resistive memory concept is the perovskite cell, in which, in a perovskite layer, a structure transition between a high- and a low-resistance state is produced by means of charge injection. Amorphous silicon continues to be used as carrier material for a resistance memory element in a resistive memory cell; said amorphous silicon, after a forming step can be switched back and forth between a high- and a low-resistance state by means of electrical pulses. Consideration is also being given at the present time to memory concepts having polymer or organic storage layers in which states having different conductivities can be produced in the layer based on charge transfer complexes that are influenced by electrical pulses.

However, commercial products based on memory concepts having a resistance memory element are as yet not known. Under discussion as an alternative, therefore, is a 1-transistor/1-resistor arrangement arranged at the crossover points of bit and word lines. Although the 1-transistor/1-resistor cell concept is distinguished by an improved isolation of the individual memory cells against interference effects, it is not possible to prevent an interference level at at least one end of the resistance memory element of the memory cell. This has a very unfavorable effect in particular in the case of memory concepts having a low operating voltage, such as the CBRAM memory, in which the memory cells are driven with a low switching voltage of approximately 300 mV. Moreover, the 1-transistor/1-resistor cell concept can only be reduced to an area requirement of 6 $F^2$.

WO 2004/001760 A1 discloses a memory circuit having memory cells which are connected in series between a plate line and a bit line and in each case have a capacitive memory element having an anode electrode and a cathode electrode, the memory element having a bipolar switching behavior and having a drive transistor connected in parallel with the memory element. The drive transistors of the memory cells are connected to a word line in order to switch the drive transistor on and off in such a way that a current path can be formed either via the associated drive transistor or via the associated capacitor. Furthermore, a changeover switch is arranged at one end of the series of memory cells in order to produce a connection between the series-connected memory cells and the bit line.

WO 2004/017328 A1 furthermore discloses a memory circuit in which the memory cells comprise individual resistance memory elements which are in each case connected up crosswise to the bit and word lines.

SUMMARY OF THE INVENTION

An object of the present invention is to provide an improved memory architecture for a memory circuit having memory cells which have a resistance memory element having a bipolar switching behavior, which element is distinguished by a minimal area requirement and effective shielding against interference when writing and reading.

One embodiment of the invention provides a memory circuit in a chain architecture in which the memory cells are connected in a series between a ground line and a bit line. The individual memory cells may have a resistance memory element having an anode electrode and a cathode electrode, with the element having a bipolar switching behavior. The individual memory cells may have a drive transistor connected in parallel with the resistance memory element, with the drive transistors of the memory cells in each case being connected to a word line in order to switch the drive transistor on and off in such a way that a current path is formed via the associated drive transistor in a non-active state of a memory cell and a current path is formed via the associated resistance memory element in an active state of a memory cell. Furthermore, a first and a second changeover switch are arranged respectively at one end of the series of memory cells in order alternately to produce a connection between the series-connected memory cells and the ground line and the bit line in a manner dependent on an applied address.

In one embodiment of the invention, an area of 4 $F^2$ is used per memory cell where F is the feature size of the fabrication technology used. At the same time, in an inactive state, in which the resistance memory element is short-circuited via the associated drive transistor, each memory cell is effectively shielded against potential fluctuations and similar interference signals. In order to activate a memory cell within the memory cell chain, the corresponding drive transistor is switched off, so that a voltage signal applied to the memory cell chain is dropped completely across the selected memory cell or a current path is formed via the non-selected drive transistors of the memory cell chain and also the selected memory resistor. The two changeover switches provided at the ends of the series of memory cells provide for alternately producing a connection between the series-connected memory cells and the ground line and the bit line depending on the position of an activated memory cell in the series of memory cells. The bipolar switching behavior of the resistance memory elements may require attention to the polarity of the resistance memory element in the reading and/or writing process. The two changeover switches may ensure that, upon the activation of the memory cell, the voltage signal is applied via the bit or ground line with the correct polarity and a corresponding current direction through the resistance memory element is thus predefined.

In one embodiment, the memory circuit has a decoder circuit that drives word lines connected to the drive transistors of the memory cells. Depending on an applied address of a memory cell, the decoder circuit switches off the drive transistor of the memory cell via the associated word line. The drive transistors of the further memory cells in the series of memory cells may remain switched on via the associated word lines. This design may allow a simple driving of the individual memory cells via the word lines with the drive transistors being switched in conductive fashion and thus short-circuiting the associated memory resistor in the non-activated state. In order to read from or write to a memory cell, the decoder may switch off the corresponding drive transistor via the associated word line, thereby canceling the bridging of the resistance memory element. Thus, each resistance element and thus each memory cell in the chain of memory cells can be accessed individually and randomly.

In one embodiment, the first changeover switch and the second changeover switch in each case have a first selection transistor connected between the series of memory cells and the ground line, and a second selection transistor connected between the series of memory cells and the bit line, and the first and second selection transistors of the changeover switches may be switched in a manner dependent on the applied address of the memory cell by the decoder circuit so that the resistance memory element is connected to the bit line by its anode electrode and to the ground line by its cathode electrode in the event of activation of the memory cell. This design of the changeover switches makes it possible to ensure in a simple manner, upon activation of a memory cell, that the anode electrode of the resistance memory element is connected to the bit line in the event of the activation operation, thereby allowing the polarity of the resistance memory element to be taken into account upon activation.

In one embodiment, the two changeover switches are driven by the decoder circuit depending on a presence of an even or odd word line address so that when one type of word line address is present, the first selection transistor of the first changeover switch and the second selection transistor of the second changeover switch are switched and, when the other type of word line address is present, the second selection transistor of the first changeover switch and the first selection transistor of the second changeover switch are switched. The distinction according to even or odd word line address may allow the changeover switches to be driven in a particularly simple manner.

In one embodiment, the decoder circuit, in a manner dependent on the least significant bit of the applied word line address, may switch a selection signal through to the second selection transistor of the first changeover switch and of the second changeover switch, respectively, which is connected between the series of memory cells and the bit line, and activate the first selection transistor of the second changeover switch and of the first changeover switch, respectively, which is connected between the series of memory cells and the ground line. This design may allow a simple driving of the changeover switch by evaluation of only a single address bit.

In one embodiment, for a space-saving memory cell architecture, the resistance elements of adjacent memory cells in each case may have a common contact, so that three contacts are used for two resistance memory elements lying next to one another.

In one embodiment, the memory cell architecture may be used in CBRAM memory cells having a porous, highly resistive ionically conductive resistance memory carrier material, in phase memory cells having a resistance memory carrier material that switches between an amorphous and a crystalline phase state, in perovskite memory cells having a perovskite resistance memory carrier material, in Si:H memory cells having amorphous silicon as resistance memory carrier material, in polymer memory cells having a polymer resistance memory carrier material, or in organic memory cells having an organic carrier material as resistance memory carrier material.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
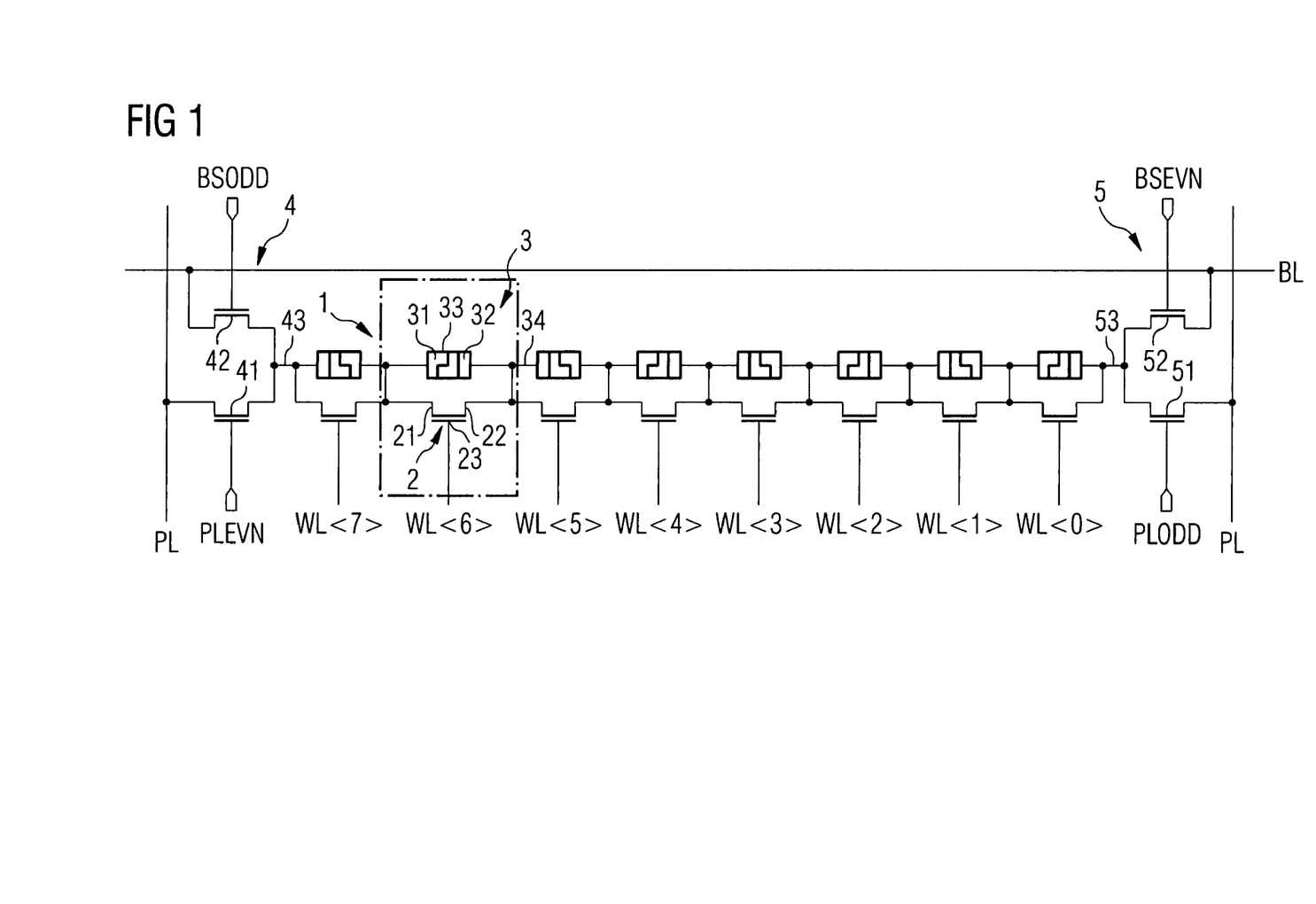
FIG. 1 schematically shows a chain architecture according to the invention for a memory circuit having memory cells which have a resistance memory element.

FIG. 1 schematically shows a detail from a memory circuit according to one embodiment of the invention with eight memory cells 1 connected in series between a ground line PL and a bit line BL. Each memory cell 1 has a drive transistor 2 and a resistance memory element 3, which are connected in parallel. As depicted, the resistance memory element 3 is composed of a cathode electrode 31, an anode electrode 32 and a storage layer 33 situated in between and is distinguished by a bipolar switching behavior. In other words, the polarity of the voltage applied between the electrodes of the resistance memory element 3 influences the activation operation of the resistance memory element 3.

In one embodiment, the bipolar resistance memory element 3 is a resistance memory element that is also known as a PMC (programmable metallization cell), where the anode electrode 32 is a reactive electrode and the cathode electrode 31 is an inert electrode, between which a porous, highly resistive ionically conductive solid electrolyte is provided as storage material. Through application of a positive voltage between reactive anode electrode 32 and negative cathode electrode 31, the reactive anode electrode is dissolved electrochemically and metal-rich deposits in the solid electrolyte matrix are intensified, so that finally a conductive path arises between the anode electrode and the cathode electrode through the solid electrolyte. This conductive path can then be cleared away again by applying a negative voltage between anode electrode 32 and cathode electrode 31, the ions released into the electrolyte material by the reactive anode electrode depositing on the anode electrode again. The PMC resistance memory cells can thus be switched back and forth between a high-resistance state and a low-resistance state by means of electrical pulses that are applied alternately between the anode electrode and the cathode electrode.

Suitable solid electrolytes for use in PMC resistance memory elements may include chalcogenide compounds with elements of the sixth main group such as arsenic, selenium, sulfur, tellurium and compounds having semiconductor properties which can readily be processed together with silicon in the context of the memory cell fabrication. Therefore, GeS or GeSe is may be used as electrolyte material. By way of example, silver or copper may be used as a reactive anode electrode which releases metal ions into the electrolyte material as a result of the electrical pulses.

Figure 3A:
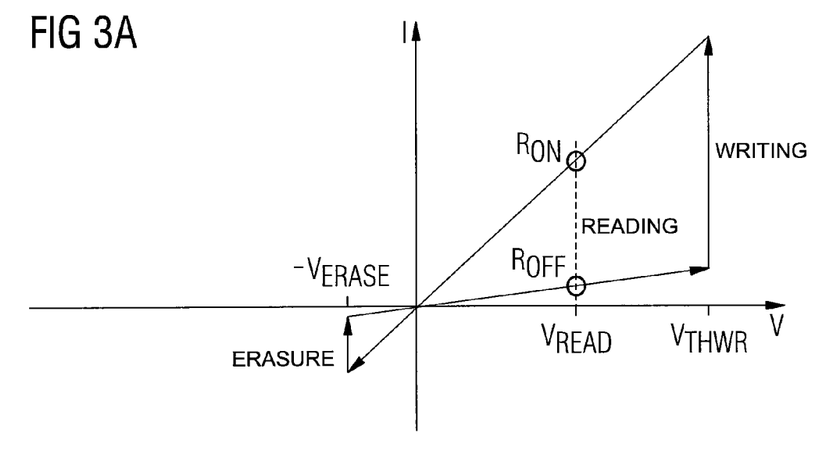
FIGS. 3A and B schematically show the characteristic curve of a PMC resistance memory element and a polymer resistance memory element such as can be used in the chain architecture according to the invention.

FIG. 3A schematically shows the current/voltage characteristic curve of a PMC resistance memory element. The characteristic curve is asymmetrical. Thus, the magnitude of the write voltage, i.e., the positive voltage $V_{THWR}$ at which the PMC resistance memory element 3 is changed over from a high-impedance state to the low-impedance state as a result of a current path being formed through the electrolyte material may be greater than the magnitude of the erase voltage, i.e., the negative voltage $V_{ERASE}$ at which the memory element is switched back from the low-impedance state to the high-impedance state by terminating the current path through the electrolyte material. As depicted in FIG. 3A, reading (that is to say, ascertaining through the presence of a voltage whether the PMC resistance memory element is in the high-impedance state $R_{off}$ or in the low-impedance state $R_{on}$) may be performed with a positive read voltage $V_{READ}$ owing to the asymmetrical characteristic curve. Thus, the polarity of the voltage applied to the PMC resistance memory element may be taken into account both in the event of writing and in the event of read-out.

Figure 3B:
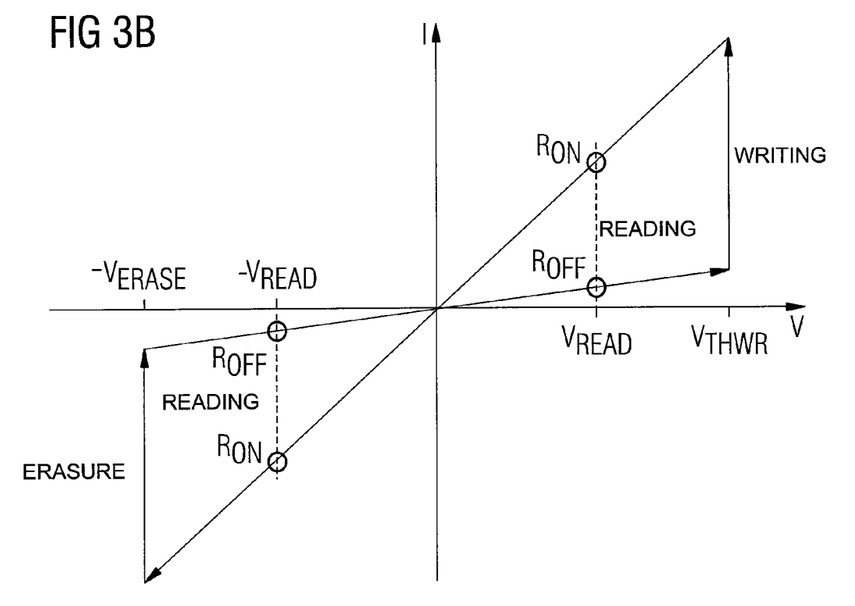

The polarity of the applied voltage may also be taken into account for other bipolar resistance memory elements. Thus, for example, a polymer resistance memory element may have a polymer as storage substance between anode and cathode electrodes in which charge transfer complexes can be formed in the storage substance by means of electrical pulses which switch back and forth between a low-impedance state and a high-impedance state. Such a polymer resistance memory element may also provide an asymmetrical characteristic curve profile, but the characteristic curve, as shown in FIG. 3B, may be voltage-symmetrical. For a polymer resistance memory cell, although the magnitude of the erase voltage $V_{ERASE}$ and the magnitude of the write voltage $V_{THWR}$ are generally identical, the writing and erasing processes may be asymmetrical. In other words, the polymer resistance memory element is changed over from the high-impedance state $R_{OFF}$ to the low-impedance state $E_{ON}$ at a positive write voltage $V_{THWR}$ and switched back from the low-impedance state to the high-impedance state by a negative erase voltage $V_{ERASE}$. The read mode, in contrast, may be symmetrical. In other words, the state of the resistance memory cell may be assessed both at a positive and a negative read voltage, $V_{READ}$ and $-V_{READ}$, respectively.

In addition to the PMC or polymer resistance memory elements, other resistance memory elements which provide a bipolar switching behavior may also be used in a memory circuit according to one embodiment of the invention. Appropriate resistance memory contacts may include, inter alia, phase change memories, in which a metal alloy, for example, a chalcogenide alloy such as GeSbTe, is heated and switched between an amorphous and a crystalline state by means of electrical pulses. The two states may have differences in their conductivity, which may be assessed with the aid of a read voltage.

One memory cell concept which utilizes a bipolar resistance memory element is a perovskite cell, in which a perovskite layer is used between the electrodes. For the perovskite layer, a charge carrier injection may provide a structure transition between a high-impedance state and a low-impedance state in the perovskite layer when a voltage is applied between the electrodes. In addition, amorphous silicon may be used as carrier material between two metal electrodes in a bipolar resistance memory element where the amorphous silicon can be switched between a high- and a low-impedance state by means of electrical pulses. This concept is also known as the Si:H memory cell concept.

In the described bipolar resistance memory elements, the conductivity can be altered through application of electrical pulses. In other words, the storage material may be changed between a low- and a high-impedance state. Memory cells based on bipolar resistance memory elements can be used both as non-volatile memory cells (such as in flash memories) and as volatile memory cells (such as in dynamic memories).

The drive transistor 2 of the memory cell 1 having a bipolar resistance memory element 3 may be, as shown in FIG. 1, a field effect transistor whose source/drain contacts 21, 22 are each connected to the anode electrode 32 and cathode electrode 31 of the resistance memory element 3. In one embodiment, the drive transistors 2 of the eight memory cells shown are switched on and off via assigned word lines WL <0>-<7> which are each connected to the gate electrode 23. It is possible to use a field effect transistor both of the enhancement mode type (normally off) and of the depletion mode type (normally on). It is then only necessary to correspondingly invert the word line drive level for switching the different types of field effect transistors on and off.

The eight memory cells 1 are connected in series with one another and each have a combination of drive transistor 2 and resistance memory element 3 connected in parallel. The memory cells 1 are each connected, as shown in FIG. 1, to the bit line BL and the ground line PL via a changeover switch 4, 5 at the ends of the series of memory cells 1. Each of the two changeover switches 4, 5 comprises two selection transistors 41, 42, 51, 52 connected in parallel, which may be field effect transistors. The first selection transistor 41, 51 of each changeover switch 4, 5 is arranged in such a way that it connects the series of memory cells 1 to the ground line PL. By contrast, the second selection transistor 42, 52 of each changeover switch 4, 5 is connected between the series of memory cells 1 and the bit line BL. The selection transistors 41, 42, 51, 52 of the changeover switches 4, 5 are driven via signal lines in such a way that no more than one selection transistor of each changeover switch 4, 5 that is turned on while the other selection transistor of the changeover switch 4, 5 turns off.

Figure 2:
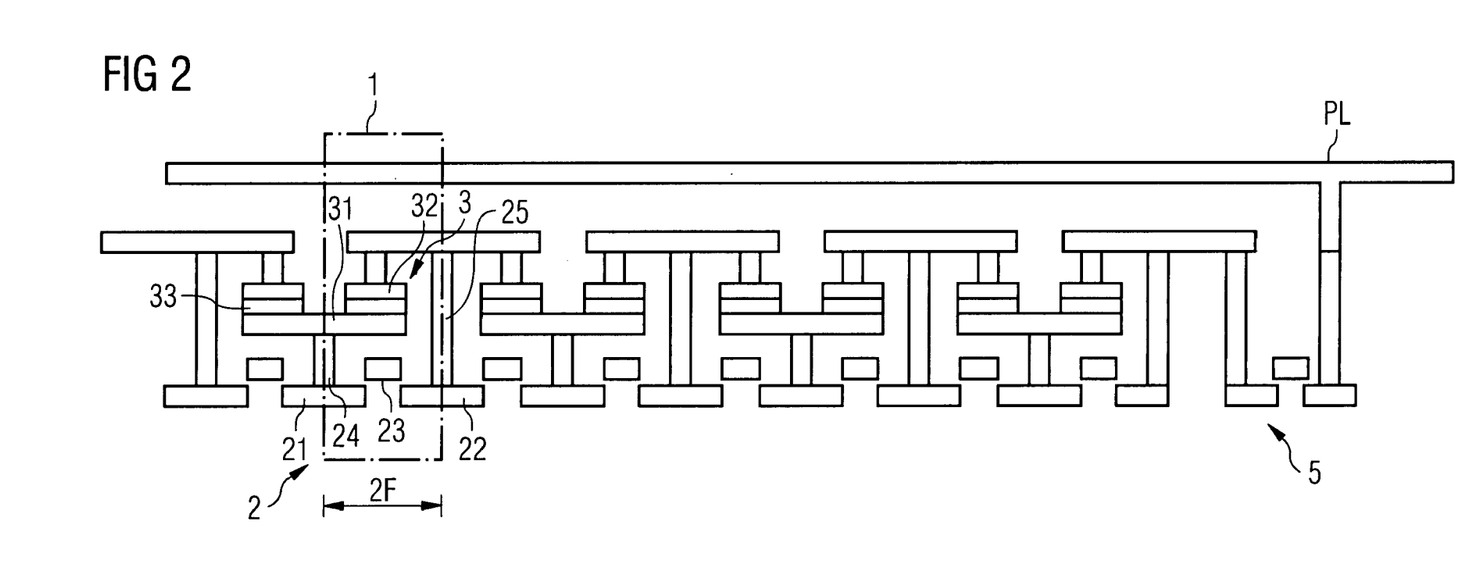
FIG. 2 shows a cross section through the chain architecture according to the invention.

As shown in FIG. 1 and the cross section in FIG. 2, the memory cells 1 are concatenated with one another in such a way that the anode electrode 32 of the resistance memory element 3 of each memory cell 1 is connected to the anode electrode 32 of the resistance memory element 3 of one adjacent memory cell 1. As shown in greater detail by the cross section in FIG. 2, this is achieved by the memory cells being formed in a semiconductor substrate in such a way that the drive transistors 2 of the memory cells 1 and the selection transistors of the changeover switches 4, 5 are arranged in a first plane, and arranged in a second plane lying above that are the resistance memory elements 3 of the memory cells 1 and above said resistance memory elements 3 in turn the bit or ground lines. The memory cells are formed so that the area requirement per memory cell is determined by the associated drive transistor. It is thus possible to form memory cells having an area requirement of 4 $F^2$, where F is the feature size of the semiconductor technology used for forming the switching arrangement.

In one embodiment, the memory cells are formed in such a way that the resistance memory element 3, in the form of a layer construction comprising cathode electrode 31, storage layer 33 and anode electrode 32, is arranged above the drive transistor 2 comprising a gate electrode 23 situated in between two source/drain contacts 21, 22. The drive transistors 2 of adjacent memory cells 1 respectively share the source/drain contacts 21, 22. By contrast, the resistance memory element 3 of one memory cell 1 has a common cathode electrode 31 with the resistance memory element 3 of one adjacent memory cell 1, and also a bridge connection 34 of the anode electrode 32 to the resistance memory element 3 of the other adjacent memory cell 1.

The drive transistor 2 of each memory cell 1 may be connected to the resistance memory element 3 via two perpendicular connecting lines 24, 25 with one connecting line 24 being connected to the common source/drain contact 21 with the drive transistor of one adjacent memory cell 1 and to the common cathode electrode 31 of the associated resistance memory elements 3 and the other connecting line 25 connecting the common source/drain contact 22 with the drive transistor 2 of the other adjacent memory cell 1 to the bridge connection 34 between the anode electrodes 31 of the associated resistance memory elements 3. The two outer memory cells 1 are connected via a further bridge connection, 43, 53 to the changeover switch 4, 5 arranged at this end of the series of memory cells 1. FIG. 2 shows in cross section the connection to the first selection transistor 51 of the second changeover switch 5 which connects the series of memory cells to the ground line PL. The selection transistor 51 is connected to the bridge connection 53 by a first source/drain contact, whereas the second source/drain contact is connected to the ground line PL. The gate electrodes of the drive transistors 2 are furthermore part of the word lines WL (0)-(7). By contrast, the gate electrodes of the selection transistors 41, 42, 51, 52 of the changeover switches 4, 5 are connected to the associated control lines PLEVN, BSODD, PLODD, BSEVN.

Figure 5:
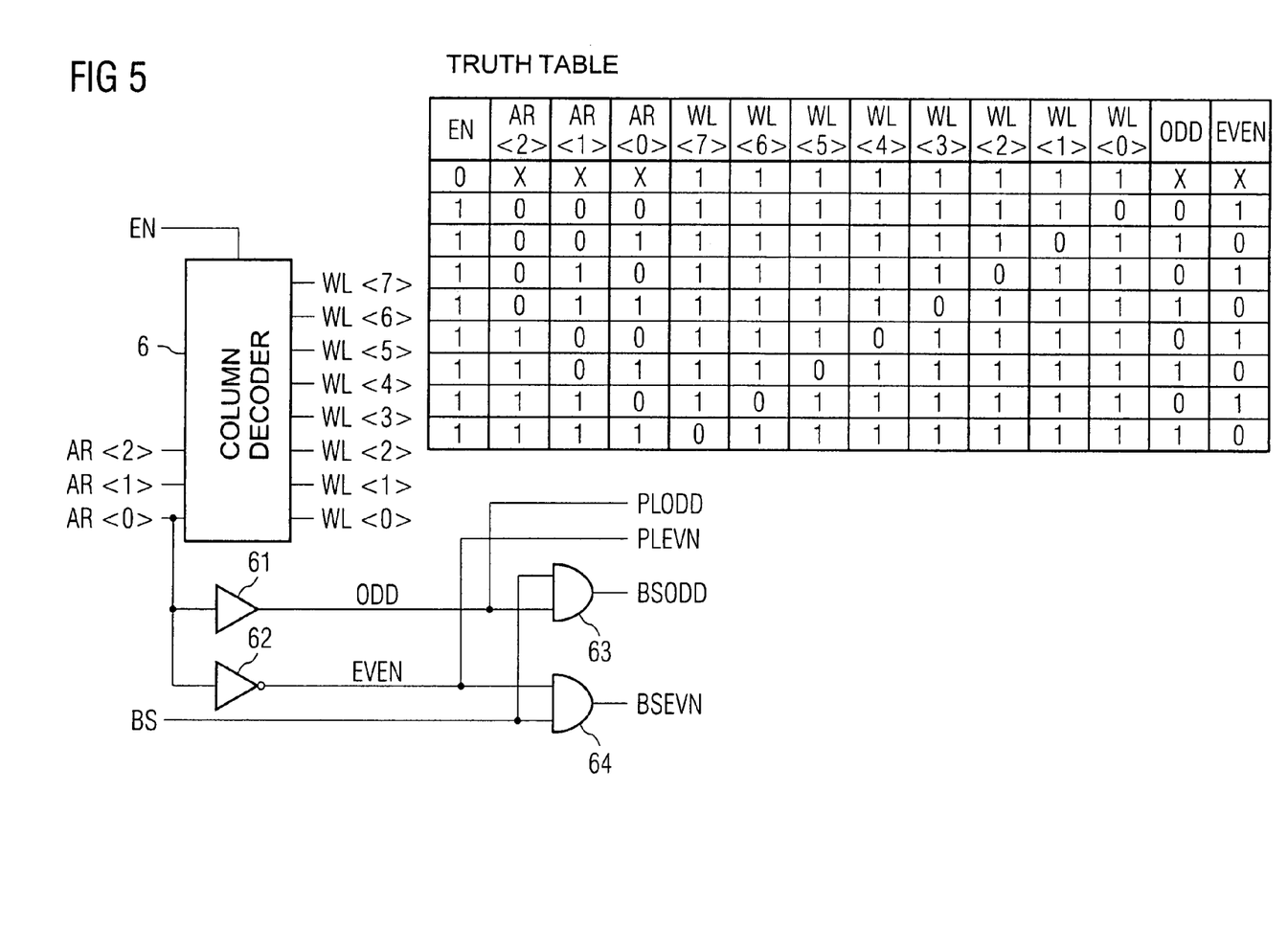
FIG. 5 shows a decoder circuit for use in the chain architecture according to the invention.

FIG. 5 shows a column decoder circuit 6 for driving the word lines WL (0)-(7) connected to the drive transistors 2 of the memory cells 1 and the signal lines PLEVN, BSODD, PLODD, BSEVN connected to the selection transistors 41, 42, 52, 53 of the changeover switches 4, 5. The column decoder circuit 6 receives, as input signals, an activation signal EN and also a word line address, which is a three-bit address AR <0>, AR <1>, AR <2> for driving the eight memory cells 1 shown in FIG. 1. Based on these two input signals, the column decoder 6 switches the eight word lines WL (0)-(7) of the drive transistors 2 of the memory cells 1 and the four signal lines PLEVN, BSODD, PLODD, BSEVN connected to the selection transistors 41, 42, 52, 53 of the changeover switches 4, 5.

The drive transistors 2 of the memory cells 1 are designed in such a way that they are switched on in the non-active state, that is to say are conducting and thus short-circuit the associated resistance memory element 3. Any current thus flows exclusively via the drive transistors 2. The bridged resistance memory elements 3 are transparent and do not contribute to the current flow. In the switching state, the resistance memory element 3 can be written to, that is to say be put into the high-resistance state from the low-resistance state, or be erased, that is to say be returned to the low-resistance state from the high-resistance state, or the memory state of the resistance memory element 3 can be read, that is to say it can be ascertained whether the resistance memory element 3 is in the high-resistance state or low-resistance state.

Connecting the drive transistor 2 in parallel with the resistance memory element 3 in the memory cell 1 provides for reliable protection of the resistance memory element 3 against interference levels when an adjacent memory cell 1 is accessed, and also against external noise signal spikes which might lead to a destruction of the stored state of the resistance memory element 3. At the same time, the parallel circuit of drive transistor 2 and resistance memory element 3 with the layered construction shown in FIG. 2 provides for an extremely compact individual memory cell 1 which, moreover, can be formed in a simple manner. Thus, the connecting lines 24, 25 between the source/drain contacts 21, 22 of the drive transistors 2 and the anode and cathode electrodes 32, 31 of the resistance memory elements 3 may be realized in a self-aligning manner.

The lateral selection transistors of the two changeover switches 4, 5 at the two ends of the series of memory cells 1 provide an additional area requirement in the series of memory cells 1, thus resulting in an effective area requirement of 4 (+X)F² per memory cell 1, where X includes the effective portion of the selection transistors 41, 42, 51, 52 of the changeover switches 4, 5 required in addition to the series of memory cells 1, and also alignment tolerances that may be additionally required with respect to the patterning of the gate electrode and the resistance memory elements 3.

Figure 4A:
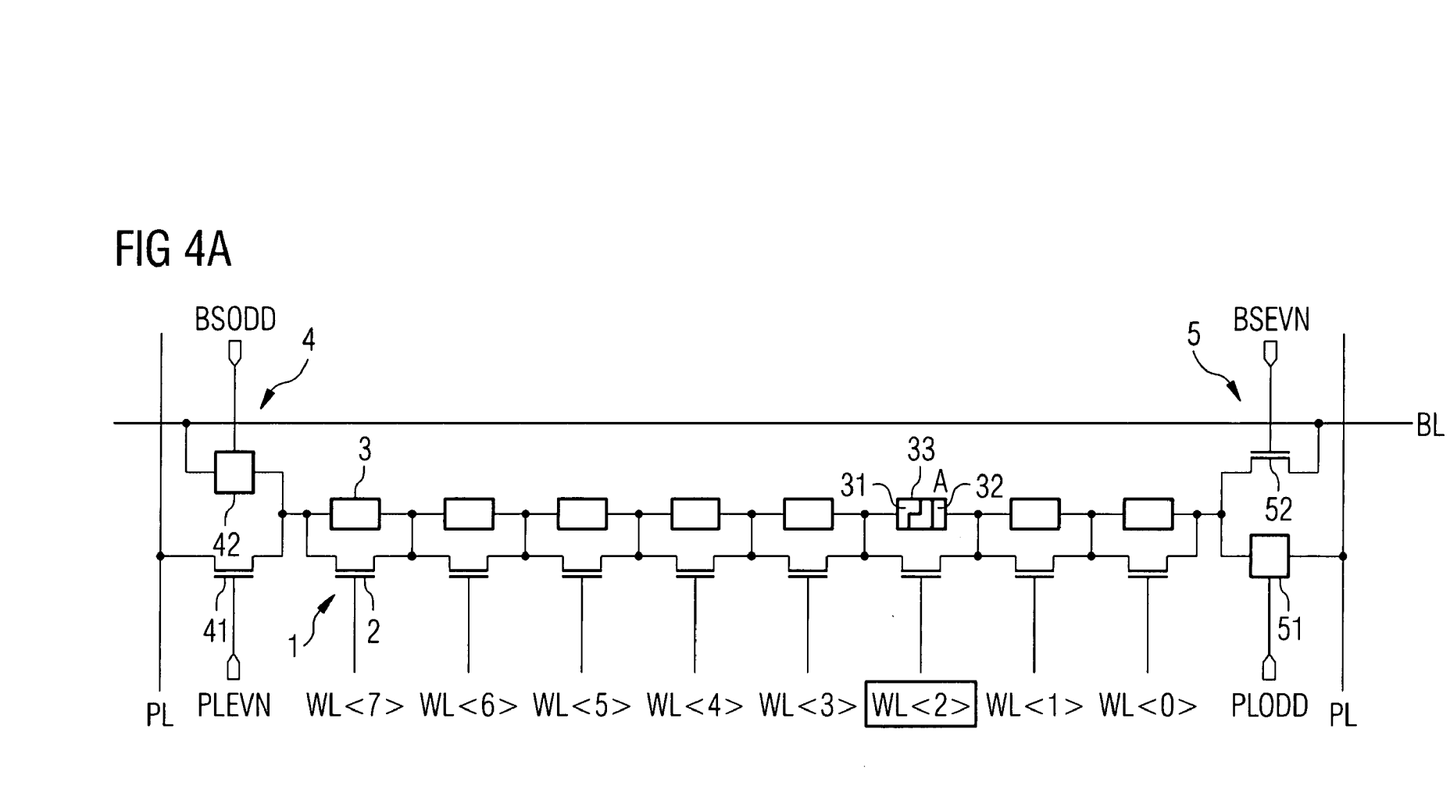
FIGS. 4A and B show the chain architecture according to the invention upon the activation of an even and an odd word line address.
Figure 4B:
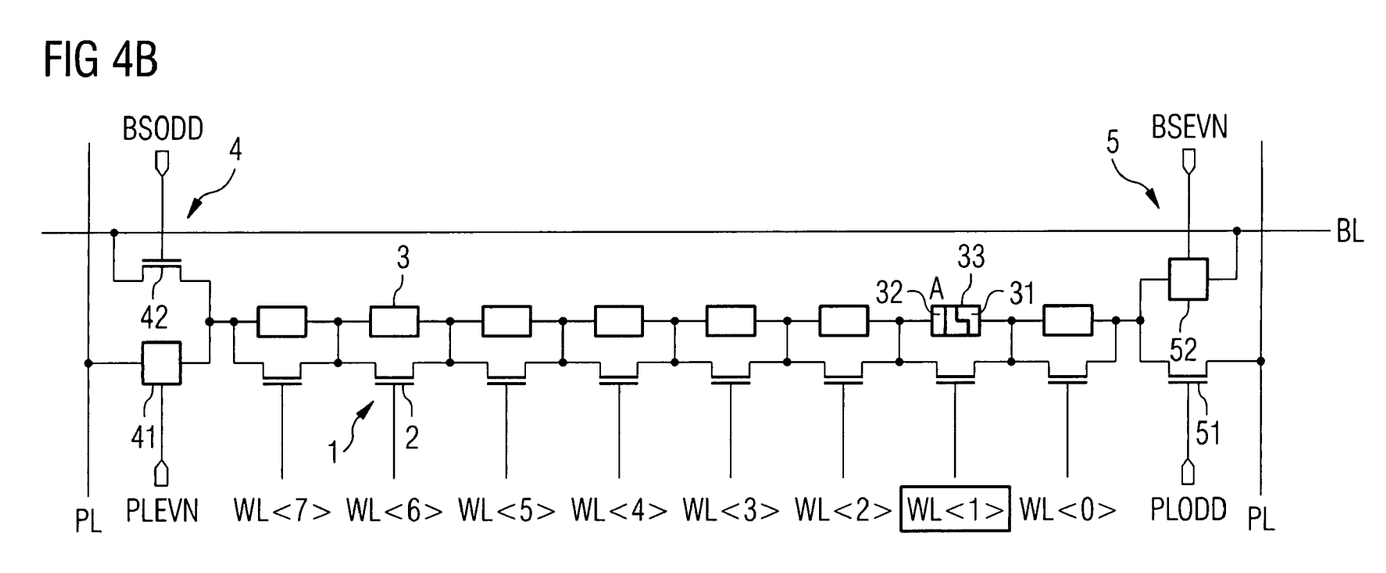

FIGS. 4A and 4B show by way of example the driving of a memory cell 1 in the memory cell chain for the purpose of performing a write/erase operation or a read operation. In the inactive state of the memory cells 1 (in the non-activated state), the column decoder 6 drives all word lines WL <0>-<7> connected to the drive transistors 2 in such a way that the drive transistors 2 are switched on, that is to say that the associated resistance memory elements 3 are bridged. Since the drive transistors 2 are generally depletion-mode field effect transistors, the word lines in the non-activated state of the memory cells 1 are for this purpose held at a high voltage potential by the common decoder 6.

In order to access a specific memory cell A within the memory cell chain, the drive transistor 2 assigned to the memory cell 1 is turned off via the assigned word line WL by the column decoder 6 and a connection to the ground line PL and to the bit line BL is produced via the two changeover switches 4, 5. The changeover switches 4, 5 are driven in such a way that, in the case of the memory cell 1 to be activated, the anode electrode 32 of the resistance memory element 3 is connected to the bit line BL, and the cathode electrode 31 to the ground line PL.

FIG. 4A shows the driving—performed by the column decoder 6—of the drive transistors 2 of the memory cells 1 and also of the selection transistors 41, 42, 51, 52 of the changeover switches 4, 5 for the purpose of activating the memory cell A connected to the word line WL <2>. The corresponding word line address of the word line WL <2> is present at the three-bit-wide word line address input at the column decoder 6. As shown by the truth table in FIG. 5, the three-bit-wide word line address for the selection of the memory cell 1 selected at the word line WL <2> has the construction AR<0>=0; AR<1>=1; AR<2>=0.

Upon application of this word line address and additionally of the activation signal EN, the column decoder 6 pulls the word line WL <2> to a low voltage potential, but holds the other word lines WL <0>, WL <1>, WL <3>, WL <4>, WL <5>, WL <6>, WL <7> at the high voltage potential. As a result the drive transistor 2 of the selected memory cell A is turned off, while the drive transistors 2 of the further memory cells 1 remain conducting and thus transparent.

At the same time, the first changeover switch 4 is switched by the column decoder 6 in such a way that the second selection transistor 42, which connects the series of memory cells to the bit line BL, is switched on at a high voltage potential, but the first selection transistor 41, which connects the series of memory cells to the ground line PL, remains turned off through application of a low voltage potential. At the same time, the first selection transistor 51 of the second changeover switch 5, which connects the series of memory cells to the ground line PL, is turned off, whereas the second selection transistor 52 of the second changeover switch 5, which connects the series of memory cells to the bit line BL, is turned on by the column decoder 6. This driving ensures that the anode electrode 32 of the resistance memory element 3 of the selected memory cell A is connected to the bit line BL, whereas the ground line PL is connected to the cathode electrode 31 of the resistance memory element 3.

In one embodiment, the selection transistors 41, 42, 51, 52 of the two changeover switches 4, 5 are driven by means of the column decoder 6 in such a way that the column decoder 6 additionally utilizes the least significant bit of the word line address in order to distinguish an even (EVEN) or an odd (ODD) word line. For this purpose, an amplifier 61 and an inverter 62 are connected in parallel to the address line AR<0> with the least significant word line address bit, the inverter 62 being connected via the control line PLEVN to the first selection transistor 41 of the first changeover switch 4 and the amplifier 61 being connected via the control line PLODD to the first selection transistor 51 of the second changeover switch 5. At the same time, both the amplifier 61 and the inverter 62 are connected to an AND element 63, 64, at which a bit line activation signal BS is additionally present. The activation signal BS is then switched through by the first AND element 63 upon simultaneous application of a signal via the amplifier 61 via the signal line BSODD to the second selection transistor 42 of the first changeover switch 4. If, by contrast, simultaneously with the bit line activation signal BS, a signal is present at the second AND element 64 via the inverter 62, the bit line activation signal BS is switched through via the signal line BSEVN to the second selection transistor 52 of the second changeover switch 5. A signal is generated at the amplifier 61 whenever the least significant word address bit is 1 (that is to say, an odd word line address is present). By contrast, the inverter 62 generates a signal whenever the least significant word line address bit is 0 (that is to say an even word line address).

This design of the column decoder 6 driving of the selection transistors of the two changeover switches 4, 5 ensures that, in the case of an even word line address, as shown in FIG. 4A, the bit line activation signal BS is switched through to the second selection transistor 52 of the second changeover switch 5 and the first selection transistor 41 of the first changeover switch 4 is simultaneously activated. In the case of an odd word line address, by contrast, as shown in FIG. 4B, the bit line activation signal BS is switched through to the second selection transistor 42 of the first changeover switch 4 and the first selection transistor 51 of the second changeover switch 5 is simultaneously activated.

Potential fluctuation and similar interference signals can be reliably prevented by means of the circuit construction according to the invention with a series of memory cells comprising a combination of drive transistor 2 and resistance memory element 3 in parallel where the bipolar resistance memory element 3 is short-circuited via its drive transistor 2 in the inactive state. At the same time, the parallel arrangement of drive transistor 2 and resistance memory element 3 enables a minimal area requirement per memory cell 1. In order to activate a memory cell 1 within the series of memory cells, the associated drive transistor 2 is switched off, so that a voltage signal applied via the series of memory cells is dropped completely across the resistance memory element 3 of the selected memory cell 1 or a current signal takes the path via the non-selected drive transistors 2 and also the selected resistance memory element 3. The changeover switches 4, 5 additionally provided at the two ends of the series of memory cells for linking the bit and ground line ensure that the resistance memory elements 3 of bipolar design, in the event of activation, are connected to the bit line and ground line in such a way that the anode electrode 32 of the resistance memory element 3 is connected to the bit line BL and the cathode electrode 31 is connected to the ground line PL.

In one embodiment, the memory circuit has a multiplicity of rows of memory cells 1 arranged parallel, such as are shown in FIG. 1, which are connected via changeover switches between the associated bit line and the ground line. There is the possibility, of course, in each series of memory cells, of arranging more or fewer than eight memory cells 1 in the chain. The dimensioning of the length of the memory cells 1 may depend on the resistance value of the drive transistors 2 used.

Figure 6A:
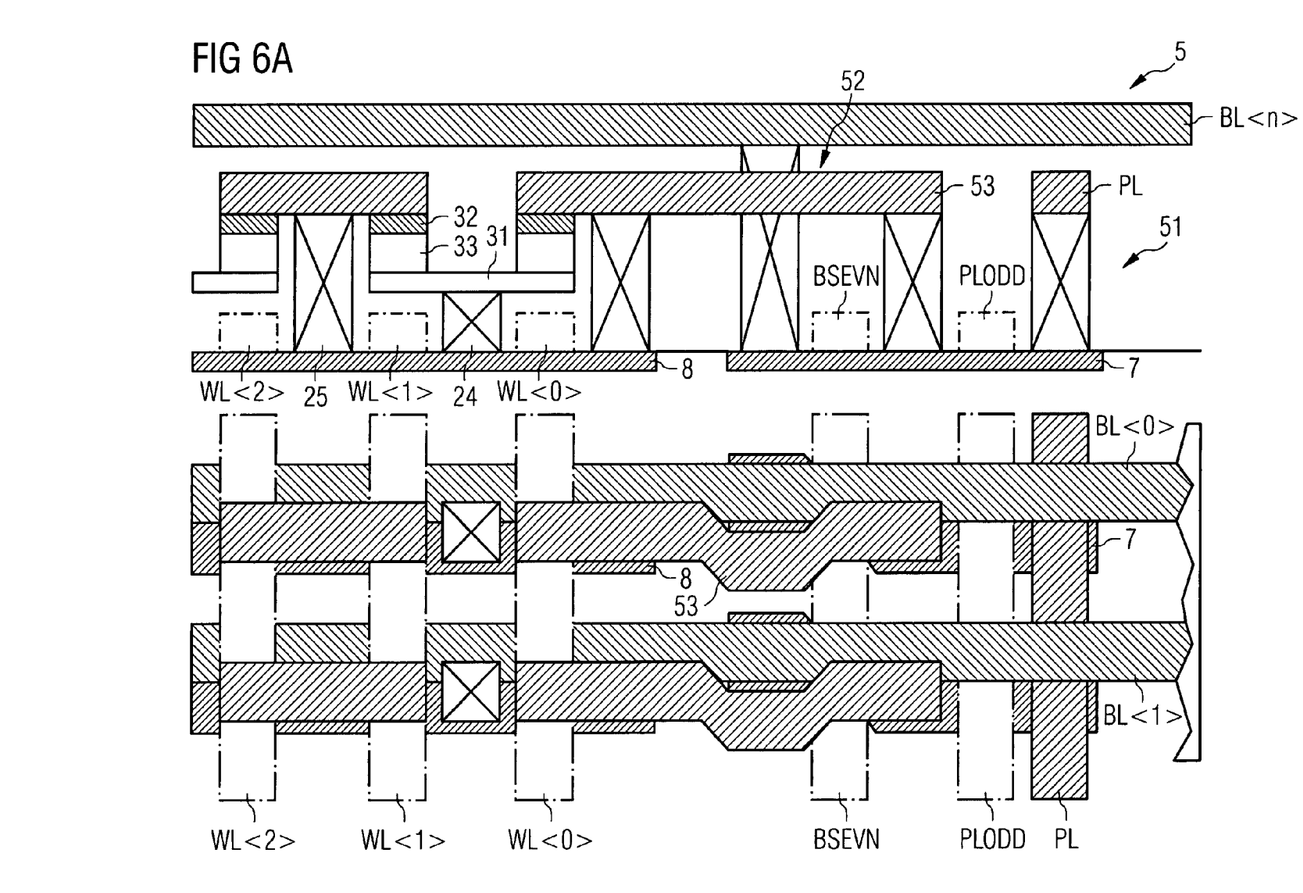
FIGS. 6A to 6C show possible embodiments of the arrangement of the memory cell chain in the chain architecture according to the invention, in cross section and in plan view.
Figure 6B:
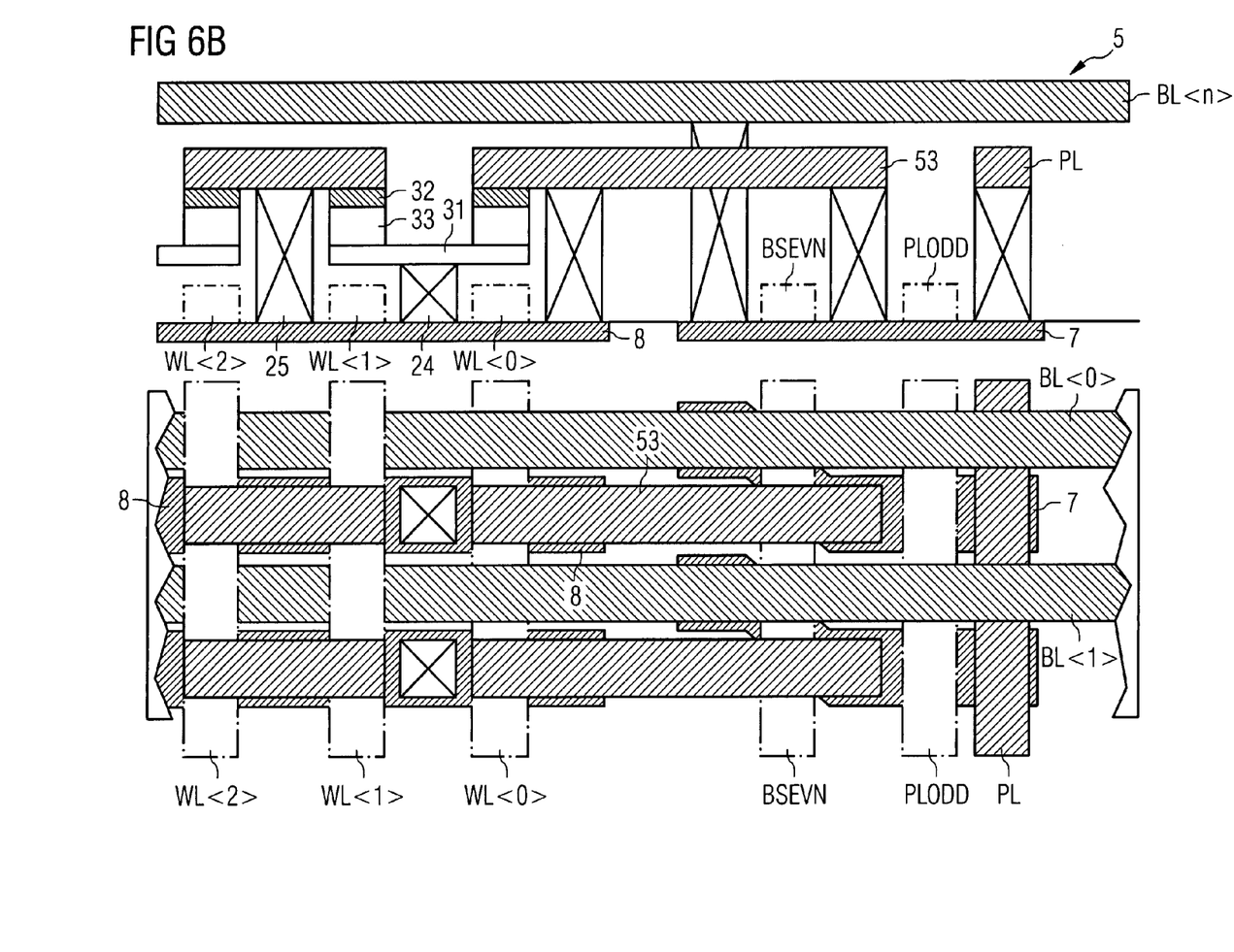
Figure 6C:
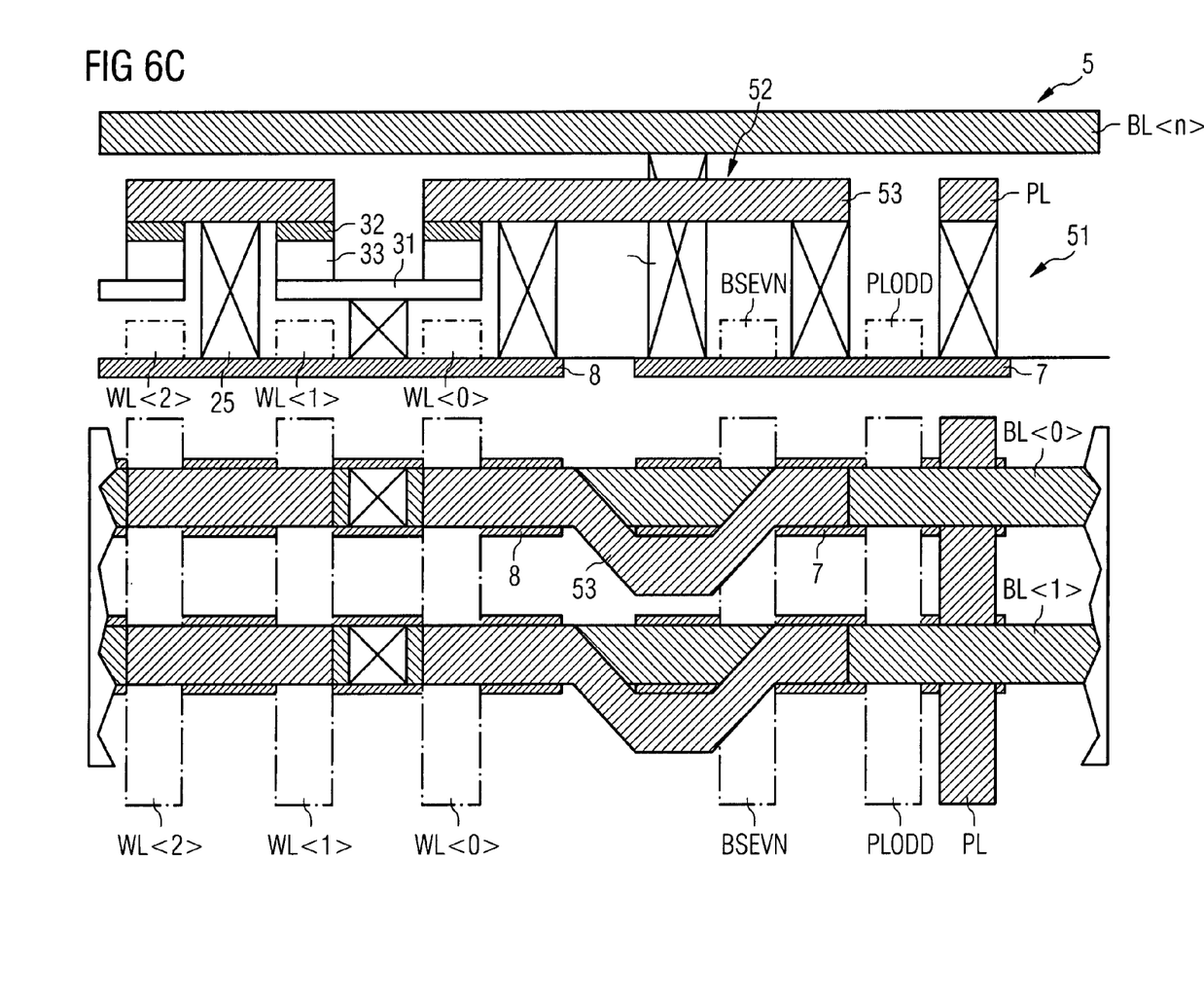

FIGS. 6A, 6B and 6C show possible layouts for connecting the memory cell chains to the bit line BL and the ground line PL in a plan view and in cross section. An end section of two adjacent series of memory cells 1 is shown in each case. The end section of the two adjacent series of memory cells 1 shown in FIGS. 6A, 6B and 6C each show the three outermost memory cells 1 with the assigned word lines WL <0>, WL <1>, WL <2> running parallel to one another and an assigned changeover switch 5 with the signal lines BSEVN and PLODD that likewise run perpendicularly. The ground line PL furthermore runs parallel to the signal lines, but in laterally offset fashion. The bit lines BL <0>, BL <1> assigned to the two series of memory cells 1 run parallel to the series of memory cells and perpendicular to the word lines, the signal lines and the ground line.

In one embodiment, the second changeover switch 5 shown in FIGS. 6A, 6B and 6C is designed in such a way that the two selection transistors 51, 52 of the second changeover switch 5 are formed on a common active layer 7 with a common central source/drain contact, to which the bridge connection 53 to the outermost memory cell 1 of the series of memory cells is connected. The second source/drain contact of the first selection transistor 51 of the changeover switch 5 shown is connected to the ground line PL and the second source/drain contact of the second selection transistor 52 of the second changeover switch 5 is connected to the assigned bit line. The memory cells 1 of the series of memory cells shown in FIGS. 6A, 6B and 6C correspond in cross section to the memory cells 1 shown in FIG. 2 with the drive transistors 2 being formed in a common active layer 8, above which the assigned resistance memory elements 3 are situated.

FIGS. 6A, 6B, and 6C show various possible configurations of the course of the active region 7 of the two selection transistors 51, 52 of the second changeover switch 5 relative to the position of the series of memory cells 1 and the bridge connection 53 to the outermost memory cell 1. In the embodiment shown in FIG. 6B, the two selection transistors 51, 52 of the changeover switches 5 are arranged in angular fashion with respect to one another, but the series of memory cells and also the first selection transistor 51 run offset in a manner parallel to the bit line assigned to the series of memory cells 1, without overlapping the bit line. The bridge connection 53, which connects the outer memory cell 1 to the common source/drain contact of the two selection transistors 51, 52 of the second changeover switch 5, is designed in rectilinear fashion in the embodiment shown in FIG. 6B, and it bypasses the bit line contact of the second selection transistor 52 of the second changeover switch 5 on account of the angular arrangement of the selection transistors.

FIG. 6C shows a further embodiment, in which the series of memory cells and the selection transistors 51, 52 of the second changeover switch 5 are arranged below the associated bit line with the active region 7 of the selection transistors 51, 52 of the second changeover switch 5 running in rectilinear fashion. The bridge connection 53, which then connects the outermost memory cell of the series of memory cells to the common source/drain contact of the two selection transistors 51, 52 of the second changeover switch is then formed such that it is bent to such an extent that it bypasses the bit line contact of the source/drain terminal of the second selection transistor 52 of the second changeover switch 5.

FIGS. 6A, 6B and 6C each show only an end region of the memory cell chain with the second changeover switch 5. With regard to its layout and its bridge connection 43 to the adjacent outermost memory cell 1 of the memory cell chain, the first changeover switch 4 is symmetrical in relation to the configurations respectively shown.

While the foregoing is directed to embodiments of the present invention, other and further embodiments of the invention may be devised without departing from the basic scope thereof, and the scope thereof is determined by the claims that follow.

What is claimed is:

1. A memory circuit, comprising:
   a plurality of memory cells connected in series between a ground line and a bit line, wherein each memory cell comprises:
   a resistance memory element having an anode electrode and a cathode electrode, the resistance memory element having a bipolar switching behavior; and
   a drive transistor connected in parallel with the resistance memory element, wherein each drive transistor is connected to a corresponding word line, wherein the corresponding wordline switches the drive transistor on and off, thereby forming a current path via the drive transistor in a deactivated state of a memory cell and forming a current path via the resistance memory element in an activated state of the memory cell;
   a first changeover switch arranged at one end of the series of memory cells; and
   a second changeover switch arranged at the other end of the series of memory cells, wherein the first changeover switch and the second changeover switch alternately produce a connection between the series-connected memory cells and the ground line and the bit line according to an address corresponding the memory cell to be activated.

2. The memory circuit of claim 1, further comprising:
   a decoder circuit configured to:
   drive the word line connected to the drive transistors of the memory cells, wherein the drive transistor of the memory cell is switched off via the corresponding word line and the drive transistors of the further memory cells in the series of memory cells are switched on via the corresponding word lines.

3. The memory circuit of claim 2, wherein the first changeover switch and the second changeover switch each comprise:
   a first selection transistor, which is connected between the series of memory cells and the ground line; and
   a second selection transistor, which is connected between the series of memory cells and the bit line, wherein the first and second selection transistors of the changeover switches are switched on by the decoder circuit according to a word line address being access, such that a selected resistance memory element is connected to the bit line by an anode electrode and to the ground line by a cathode electrode when the selected memory cell is activated.

4. The memory circuit of claim 3, wherein the decoder circuit is further configured to:

drive the first changeover switch and the second changeover switch according to an even or odd word line address applied to the decoder, wherein:
when one type of word line address is present, the first selection transistor of the first changeover switch and the second selection transistor of the second changeover switch are switched on; and
when another type of word line address is present, the second selection transistor of the first changeover switch and the first selection transistor of the second changeover switch are switched on.

5. The memory circuit of claim 1, wherein the resistance memory elements of the memory cells connected in series are connected so that resistance memory elements of adjacent memory cells in each case have a common electrode.

6. The memory circuit of claim 1, wherein the memory cells are each one of a CBRAM memory cell, a phase change memory cell, a perovskite memory cell, a Si:H memory cell, a polymer memory cell, and an organic memory cell.

7. A method for accessing a plurality of memory cells (1) which are connected in series between a first ground line (PL) and a second ground line, wherein each of the plurality of memory cells (BL) and in each case have comprises a resistance memory element and a driver transistor attached in parallel across an anode and a cathode of the resistance memory element, the method comprising:
receiving an address of a memory cell in the plurality of memory cells;
lowering a signal applied to the driver transistor attached to the memory cell and asserting a signal applied to other memory cells in the plurality of memory cells, thereby creating a current path through the resistance memory element of the memory cell;
if the address is an even address, connecting a first end of the series of memory cells to the first ground line and connecting a second end of the series of memory cells to a bitline; and
if the address is an odd address, connecting the second end of the series of memory cells to the second ground line and connecting the first end of the series of memory cells to the bitline.

8. The method of claim 7, wherein a first changeover switch comprising a first transistor connected to the bitline and a second transistor connected to the first ground line is connected to the first end of the plurality of memory cells connected in series, and wherein a second changeover switch comprising a third transistor connected to the bitline and a fourth transistor connected to the second ground line is connected to the second end of the plurality of memory cells connected in series.

9. The method of claim 8, wherein connecting the first end to the first ground line and connecting the second end to the bitline comprises activating the second transistor and the third transistor.

10. The method of claim 9, wherein connecting the second end to the second ground line and connecting the first end to the bitline comprises activating the first transistor and the fourth transistor.

11. The method of claim 7, further comprising:
writing to the memory cell, wherein writing to the memory cell comprises:
if the address is an even address, applying a write voltage across the resistance memory element from the bitline to the first ground line; and
if the address is an odd address, applying the write voltage across the resistance memory element from the bitline to the second ground line.

12. The method of claim 7, wherein the resistance memory elements are each one of a CBRAM memory cell, a phase change memory cell, a perovskite memory cell, a Si:H memory cell, a polymer memory cell, and an organic memory cell.

13. A memory device comprising:
a plurality of memory cells (1) which are connected in series between a first ground line (PL) and a second ground line, wherein each of the plurality of memory cells (BL) and in each case have comprises:
a resistance memory element; and
a driver transistor attached in parallel across an anode and a cathode of the resistance memory element;
a decoder configured to:
receive an address of a memory cell in the plurality of memory cells; lower a signal applied to the driver transistor of the memory cell and assert a signal applied to other memory cells in the plurality of memory cells, thereby creating a current path through the resistance memory element of the memory cell;
if the address is an even address, connect a first end of the plurality of memory cells connected in series to the first ground line and connect a second end of the plurality of memory cells connected in series to a bitline; and
if the address is an odd address, connect the second end of the plurality of memory cells connected in series to the second ground line and connect the first end of the plurality of memory cells connected in series to the bitline.

14. The memory device of claim 13, further comprising:
a first changeover switch comprising a first transistor connected to the bitline and a second transistor connected to the first ground line wherein the second changeover switch is connected to the first end of the plurality of memory cells connected in series; and
a second changeover switch comprising a third transistor connected to the bitline and a fourth transistor connected to the second ground line, wherein the second changeover switch is connected to the second end of the plurality of memory cells connected in series.

15. The memory device of claim 14, wherein connecting the first end to the first ground line and connecting the second end to the bitline comprises activating the second transistor and the third transistor.

16. The memory device of claim 15, wherein connecting the second end to the second ground line and connecting the first end to the bitline comprises activating the first transistor and the fourth transistor.

17. The memory device of claim 16, further comprising: write circuitry configured to write to the memory cell, wherein writing to the memory cell comprises:
if the address is an even address, applying a write voltage across the resistance memory element from the bitline to the first ground line; and
if the address is an odd address, applying the write voltage across the resistance memory element from the bitline to the second ground line.

18. The memory device of claim 17, wherein the resistance memory elements are each one of a CBRAM memory cell, a phase change memory cell, a perovskite memory cell, a Si:H memory cell, a polymer memory cell, and an organic memory cell.

19. A memory device comprising:
a plurality of means for storing (1) which are connected in series between a first ground line (PL) and a second ground line, wherein each of the plurality of means for storing (BL) and in each case have comprises:
a memory element; and
means for driving attached in parallel across an anode and a cathode of the memory element;
means for controlling configured to:
receive an address of one of the means for storing in the plurality of means for storing;
lower a signal applied to the means for driving for the one of the means for storing and assert a signal applied to other means for storing in the plurality of means for storing, thereby creating a current path through the memory element of the means for storing;
if the address is an even address, connect a first end of the plurality of means for storing to the first ground line and connect a second end of the plurality of means for storing to a bitline; and
if the address is an odd address, connect the second end of the plurality of means for storing connected in series to the second ground line and connect the first end of the plurality of means for storing connected in series to the bitline.

20. The memory device of claim 19, further comprising:
a first means for switching comprising a first transistor connected to the bitline and a second transistor connected to the first ground line wherein the second means for switching is connected to the first end of the plurality of means for storing; and
a second means for switching comprising a third transistor connected to the bitline and a fourth transistor connected to the second ground line, wherein the second means for switching is connected to the second end of the plurality of means for storing.

21. The memory device of claim 20, wherein connecting the first end to the first ground line and connecting the second end to the bitline comprises activating the second transistor and the third transistor.

22. The memory device of claim 21, wherein connecting the second end to the second ground line and connecting the first end to the bitline comprises activating the first transistor and the fourth transistor.

23. The memory device of claim 22, further comprising: means for writing configured to write to the one of the means for storing, wherein writing to the one of the means for storing comprises:
if the address is an even address, applying a write voltage across the memory element of the one of the means for storing from the bitline to the first ground line; and
if the address is an odd address, applying the write voltage across the memory element one of the means for storing from the bitline to the second ground line.

24. A memory device comprising:
a plurality of memory cells (1) which are connected in series between a first ground line (PL) and a second ground line, wherein each of the plurality of memory cells (BL) and in each case have comprises:
a resistance memory element;
a driver transistor attached in parallel across an anode and a cathode of the resistance memory element; and
wherein one of the anode and the cathode are attached to a corresponding one of an anode or a cathode of an adjacent memory cell;
a decoder configured to:
if an address applied to the decoder circuit is an even address, connect a first end of the plurality of memory cells connected in series to the first ground line and connect a second end of the plurality of memory cells connected in series to a bitline; and
if the address applied to the decoder circuit is an odd address, connect the second end of the plurality of memory cells connected in series to the second ground line and connect the first end of the plurality of memory cells connected in series to the bitline.

25. The memory device of claim 24, further comprising:
a first changeover switch comprising a first transistor connected to the bitline and a second transistor connected to the first ground line wherein the second changeover switch is connected to the first end of the plurality of memory cells connected in series by a first bridge; and
a second changeover switch comprising a third transistor connected to the bitline and a fourth transistor connected to the second ground line, wherein the second changeover switch is connected to the second end of the plurality of memory cells connected in series by a second bridge.

26. The memory device of claim 25, wherein the first bridge is connected to a shared node of the first transistor and second transistor and to the first end of the plurality of memory cells connected in series, wherein the bridge is routed in a first layer of metal below a second layer of metal in which the bitline is routed 27. The memory device of claim 26, and wherein the bridge is routed around a via from the bitline in the second layer of metal to an end of the first transistor.

* * * * *